Feb. 26, 1957 G. L. CLAPPER 2,783,316

CATHODE FOLLOWER TYPE PULSE AMPLIFIER

Filed Feb. 4, 1953

INVENTOR.
GENUNG L. CLAPPER
BY John P. Doherty
ATTORNEY

United States Patent Office 2,783,316 Patented Feb. 26, 1957

2,783,316

CATHODE FOLLOWER TYPE PULSE AMPLIFIER

Genung L. Clapper, Vestal, N. Y., assignor to International Business Machines Corporation, New York, N. Y., a corporation of New York Application February 4, 1953, Serial No. 335,042

3 Claims. (Cl. 179—171)

This invention relates to power amplifiers and more particularly to pulse amplifiers.

In the past, power amplifiers of the cathode follower type have been used where it was desired to produce an output pulse having a sharp positive going edge. This type of circuit has had the disadvantage that the voltage amplification has been less than unity. A second disadvantage of this type of circuit has been the adverse effect on the negative going edge of a pulse produced by the necessity of the capacitive component of the load to discharge through the cathode resistance. This disadvantage has in the past been partially overcome by chopping. The word "chopping" is used to graphically describe the process of trimming up a pulse on a heavily loaded line by quickly removing the capacitive charge upon the line. A cathode follower will raise a line quickly, and so exhibit very little phase shift and loss of pulse shaping on the positive going side of a pulse. The down or negative-going side will be adversely affected by capacitive loading. The time constant of the circuit will be a function of the cathode load resistor and the capacitance across it. Since the capacitance of the line and the load are fixed, the only way to reduce the time constant is to reduce the cathode resistor. In chopping a line, this is accomplished by means of a diode connected to a low impedance driver. Here the grid of the cathode follower has tended to remain more positive than, or lag, the negative-going input signal resulting in a condition tending to cause greater conduction in the cathode follower tube and thus oppose the effect of the chopping pulse applied to the output circuit.

It is an object of this invention to provide an improved circuit of the type involved which overcomes the disadvantages of the prior art circuits.

Another more specific object of this invention is to provide an improved cathode folower type pulse amplifier wherein a voltage amplification factor greater than unity is obtainable.

Another object of this invention is to provide an improved pulse amplifier capable of operating at high frequencies.

Other objects of the invention will be pointed out in the following description and claims and illustrated in the accompanying drawings, which disclose, by way of examples, the principle of the invention and the best mode, which has been contemplated, of applying that principle.

Figure 1:
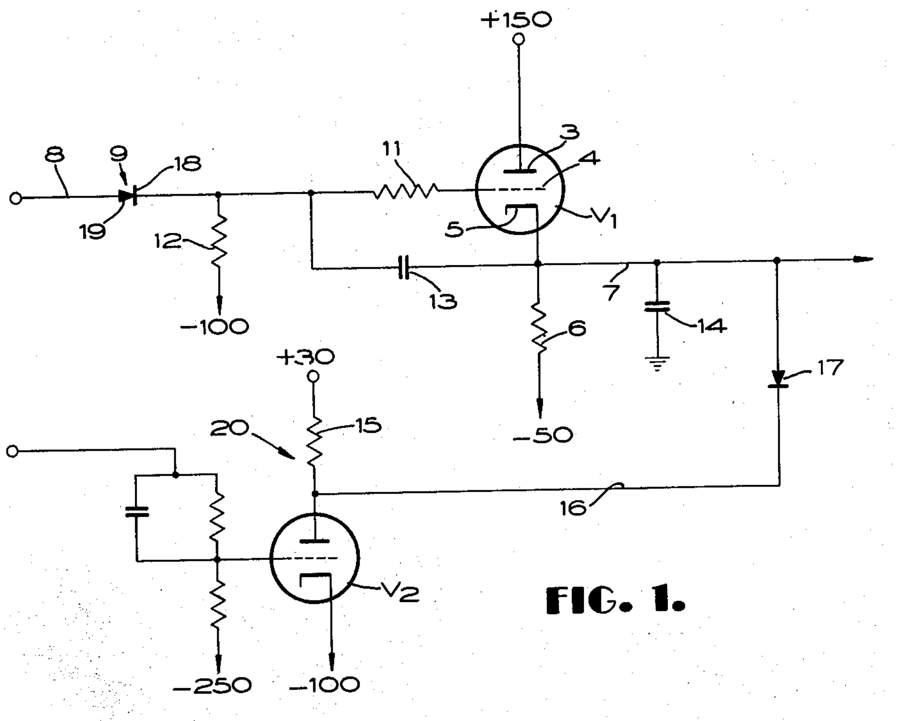
Fig. 1 is a schematic diagram of a pulse amplifier made in accordance with this invention.

Referring to the drawings there is shown in Fig. 1 a pulse amplifier incorporating a chopper circuit. The pulse amplifier includes tube V1 having a plate 3, a grid 4 and a cathode 5. A cathode resistor 6 is provided for tube V1 across which the output of the pulse amplifier is taken over output line 7. An input signal to the pulse amplifier is applied to line 8 and fed through a germanium diode 9, having a cathode 18 and an anode 19, or any other type of rectifier to the grid 4 of tube V1. A grid current limiting resistor 11 and an input load biasing resistor 12 are provided in the grid circuit of tube V1. A condenser 13, the function of which will be pointed out hereafter, is connected between the cathode 5 of tube V1 and the input side of resistor 11. A capacitor 14 is shown connected between line 7 and ground. This capacitor may represent only the inherent capacitance of the output circuit and load or it may represent an actual condenser built into the circuit combined with any inherent capacitance of the output circuit. The form that the capacitor 14 takes is immaterial to the operation of the pulse amplifier.

Figure 2:
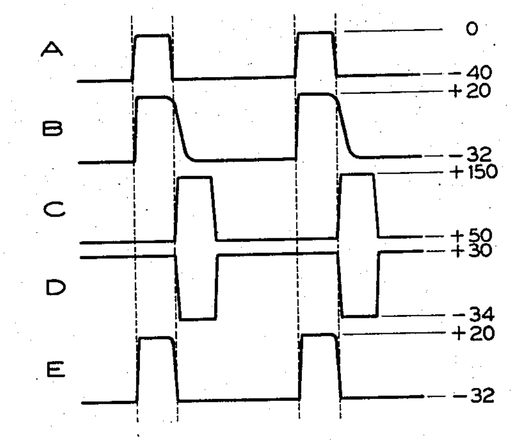
Fig. 2 is a showing of representative wave forms occurring at various points throughout the circuit shown in Fig. 1.

When a positive going input pulse shown as A in Fig. 2 is applied to line 8, the diode 9 passes the pulse to the grid 4 of tube V1 through resistor 11. This pulse is also impressed on condenser 13. Since condenser 13 is in series with capacitor 14 the voltage of the pulse impressed on condenser 13 is instantaneously distributed between condenser 13 and capacitor 14 in proportion to the relative sizes of the two, giving an instantaneous output on line 7 equal to the voltage distributed across capacitor 14. This pulse initially raises grid 4 with respect to cathode 5 and capacitor 13 tends to maintain this condition. As tube V1 conducts, capacitor 14 charges through this tube toward the positive side of the power supply causing line 7 to rise in potential. The rise in potential on line 7 is reflected back through condenser 13 to raise the grid 4 an equal amount, to a potential above the potential of the input pulse. Diode 9 enables grid 4 of tube V1 to rise above the potential of line 8. As capacitor 14 charges, the line 7 will rise until the current drawn by the output load equals the current drawn by tube V1 as dictated by the characteristics of the tube for given voltages on the tube's various elements. After an initial peak the potential of line 7 will drop as condenser 13 charges through resistor 12 and tube V1 to lower the potential of grid 4 with respect to cathode 5. This drop will continue until grid 4 reaches the level of the input pulse at which time diode 9 allows line 8 to again take control. However, if the pulses to be amplified are of relatively short duration a voltage amplification greater than unity may be had for the duration of the pulses. The voltage wave form appearing on line 7, without the use of chopping, is indicated at B in Fig. 2. By way of example to roughly illustrate relative magnitudes some voltage values are indicated in Fig. 1 and Fig. 2. It is seen that for pulses of short duration a voltage amplification factor greater than unity may be obtained with the above described circuit.

As seen at B in Fig. 2 the trailing edges of positive-going pulses tend to be rounded off if the capacitive component of the output load must discharge through the cathode resistance of the pulse amplifier. This rounding off effect may be reduced by chopping. A chopper driver 20 is shown in Fig. 1 including tube V2 and resistor 15. An input pulse shown as C in Fig. 2 having a leading edge corresponding in time to the trailing edge of the input pulse to the pulse amplifier is applied to the chopper driver. The chopper driver 20 produces a negative going output pulse, shown as D in Fig. 2, on line 16, having a leading edge corresponding in time to the trailing edge of the input pulse to the pulse amplifier, shown at A. This negative going pulse is applied over line 16 and through a rectifier, shown as a germanium diode 17, to line 7. Normally the anode of diode 17 is at a potential below its cathode so that the diode has no effect on the pulse amplifier circuit. However when a negative going pulse is applied to line 16 the diode 17 conducts and passes the negative pulse to line 7 to sharply chop off the trailing edge of the output of the pulse amplifier. This is accomplished by the low impedance path through diode 17 and tube V2 now conductive to the negative side of the power supply.

When chopping is applied to the pulse amplifier described above, the condenser 13 between cathode 5 and grid 4 of tube V1 serves a dual purpose. It not only provides regeneration of the positive going input pulse to the pulse amplifier but also couples the chopper pulse to grid 4, so that the grid and cathode are brought down together. This prevents the conflicting action that would take place if the cathode were brought down while the grid was still up. With a pulse amplifier constructed as described above and a chopper circuit connected to the output circuit of the pulse amplifier an amplified and shaped pulse shown as E in Fig. 2 is produced.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A cathode follower type pulse amplifier for driving a capacitive load connected between said amplifier and a point of reference potential comprising a vacuum tube having a grid and a cathode, an input terminal for receiving positive going pulses to be amplified, conductive means providing a direct current conductive path between said terminal and said grid including a rectifier polarized to pass positive going pulses from said input terminal to said grid, an output circuit connected to said cathode for connection to said capacitive load, a cathode resistor connected between said point of reference potential and said cathode, and a condenser coupled between said cathode and a point on said conductive means intermediate said rectifier and said grid, the magnitude of said condenser being so selected with relation to the capacity of the load that by virtue of the isolating effect of said rectifier the regenerative feedback to said grid through said condenser in response to a change in conduction through said vacuum tube is of sufficient amplitude to raise said grid to a potential level above the potential level of the input pulse, thereby providing a cathode follower having an amplification factor greater than unity.

2. A cathode follower type pulse amplifier for driving a capacitive load connected between said amplifier and a point of reference potential comprising a vacuum tube having a grid and a cathode, an input terminal for receiving pulses to be amplified, a diode having an anode connected to said terminal and a cathode, conductive means providing a direct current conductive path between the cathode of said diode and said grid, a cathode resistor connected between said cathode of said vacuum tube and said point of reference potential, an output circuit for connection to said capacitive load connected to said cathode of said vacuum tube, and a condenser coupled between said cathode of said vacuum tube and a point on said conductive means, the magnitude of said condenser being so selected with relation to the capacity of the load that by virtue of the isolating effect of said diode the regenerative feedback to said grid through said condenser in response to a change in conduction through said vacuum tube is of sufficient amplitude to raise said grid to a potential level above the potential level of an input pulse, thereby providing a cathode follower having an amplification factor greater than unity.

3. A cathode follower type pulse amplifier for driving a capacitive load connected between said amplifier and a point of reference potential comprising a vacuum tube having a grid and a cathode, an input terminal for receiving pulses to be amplified, a diode having an anode connected to said terminal and a cathode, conductive means providing a direct current conductive path between the cathode of said diode and said grid, a cathode resistor connected between said cathode of said vacuum tube and said point of reference potential, an output circuit connected to said cathode of said vacuum tube for connection to said capacitive load, means for applying a negative going pulse to said output circuit upon the termination of a positive going pulse on said input circuit, and a condenser coupled between said cathode of said vacuum tube and a point on said conductive means, the magnitude of said condenser being so selected with relation to the capacity of the load that by virtue of the isolating effect of said diode the regenerative feedback to said grid through said condenser is of sufficient amplitude to raise said grid to a potential level above the potential level of an input pulse in response to increased conduction through said vacuum tube, whereby variations in potential on said output circuit are regeneratively fed back to said grid to provide a sharply terminated pulse on said output circuit of greater voltage amplitude than the input pulse.

References Cited in the file of this patent

UNITED STATES PATENTS

| | | |
|---|---|---|
| 2,266,154 | Blumlein | Dec. 16, 1941 |
| 2,503,909 | Hollingsworth | Apr. 11, 1950 |
| 2,603,750 | Newman | July 15, 1952 |
| 2,662,938 | Goldstine | Dec. 15, 1953 |
| 2,688,664 | Stites et al. | Sept. 7, 1954 |